United States Patent [19]
Fosnight et al.

[11] Patent Number: 6,056,026
[45] Date of Patent: May 2, 2000

[54] PASSIVELY ACTIVATED VALVE FOR CARRIER PURGING

[75] Inventors: William J. Fosnight; Joshua W. Shenk, both of Austin, Tex.

[73] Assignee: Asyst Technologies, Inc., Fremont, Calif.

[21] Appl. No.: 09/204,320

[22] Filed: Dec. 2, 1998

Related U.S. Application Data

[60] Provisional application No. 60/110,636, Dec. 1, 1998.

[51] Int. Cl.$^7$ ....................................................... B65B 1/04
[52] U.S. Cl. ............................................. 141/98; 414/217
[58] Field of Search .............................. 141/98, 351, 353, 141/354, 359, 369, 370, 65; 414/217, 221, 292, 939

[56] References Cited

U.S. PATENT DOCUMENTS

| | | | |
|---|---|---|---|
| 5,810,062 | 9/1998 | Bonora et al. | 141/351 |
| 5,879,458 | 3/1999 | Roberson, Jr. et al. | 118/715 |
| 5,988,233 | 11/1999 | Fosnight et al. | 141/63 |

*Primary Examiner*—Steven O. Douglas
*Attorney, Agent, or Firm*—Fliesler, Dubb, Meyer & Lovejoy LLP

[57] ABSTRACT

A valve seated within a SMIF pod support platform is disclosed for activating and deactivating the flow of gas to a pod on the platform. In preferred embodiments, the valve includes a central poppet capable of moving between a first, closed position where the poppet blocks the flow of gas through the valve, and a second, open position where the poppet allows gas flow through the valve. In the absence of a pod on the support platform, pressurized gas from the gas source downstream of the valve biases the poppet into the first position to thereby block gas flow. In this first position, a top portion of the poppet extends slightly above the upper surface of the pod support platform. When a pod is seated on the support platform, the weight of the pod moves the poppet from its first position to its second position where gas is allowed to flow through the valve and into the pod to allow purging of the pod.

9 Claims, 5 Drawing Sheets

PASSIVELY ACTIVATED VALVE FOR CARRIER PURGING

CLAIM OF PRIORITY

This application claims the benefit of U.S. Provisional Application Ser. No. 60/110,636 filed Dec. 1, 1998.

CROSS REFERENCE TO RELATED PATENTS AND APPLICATIONS

The present application is related to the following United States Patents and Patent Applications, which Patents and Applications are owned by the assignee of the present invention and which Patents and Applications are hereby incorporated by reference in their entirety:

U.S. Pat. No. 4,724,874, entitled "Sealable Transportable Container Having a Particle Filtering System", issued Feb. 16, 1988 (Attorney Docket No. ASYS4626);

U.S. Pat. No. 5,810,062, entitled "Two Stage Valve For Charging And/Or Vacuum Relief of Pods", issued Sept. 22, 1998 (Attorney Docket No. ASYS7960);

U.S. patent application Ser. No. 09/049,330, entitled "Kinematic Coupling Compatible, Passive Interface Seal", filed Mar. 27, 1998, which application is currently pending (Attorney Docket No. ASYS7993);

U.S. patent application Ser. No. 09/049,461, entitled "Evacuation-Driven SMIF Pod Purge System", filed Mar. 27, 1998, which application is currently pending (Attorney Docket No. ASYS7975); and U.S. patent application Ser. No. 09/049,354, entitled "Modular SMIF Pod Breather, Adsorbent, and Purge Cartridges", filed Mar. 27, 1998, which application is currently pending (Attorney Docket No. ASYS7994).

BACKGROUND OF THE INVENTION

1. Field of the Invention

The present invention relates to systems for allowing gas to be controllably injected into SMIF pods, and more particularly to a passive gas flow valve that is actuated between its closed and open positions by the weight of the pod.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironrnent without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulkich Kaempf, *Solid State Technology*, Jul. 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles become of interest.

In practice, a SMIF pod is set down on various support surfaces within a wafer fab, such as for example at a load port to a minienvironment, whereupon interface mechanisms in the load port open the pod door to allow access to the wafers within the pod. Additionally, a pod may be supported at a storage location while awaiting processing at a particular tool. Such storage locations may comprise a local tool buffer in the case of metrology or high throughput tools, or may alternatively comprise a stocker for storing large numbers of pods within a tool bay. A pod may additionally be positioned at a stand-alone purge station.

Whether a tool load port, local tool buffer, stocker or purge station, the support surfaces typically include registration or kinematic pins protruding upward from the support surface. In 200 mm pods, the support surface includes registration pins and guide rails which guide the pod into the proper rotational and translational position with respect to the pins. In 300 mm pods, a bottom surface of the pods includes radially extending grooves for receiving kinematic pins. Once the pod is positioned so that the grooves engage their respective kinematic pins, the grooves settle over the pins to establish six points of contact between the pod and support platform (at the grooves and pins) to kinematically couple the pod to the support platform with fixed and repeatable accuracy. Such a kinematic coupling is for example disclosed in U.S. Pat. No. 5,683,118, entitled "Kinematic Coupling Fluid Couplings and Method", to Slocum, which patent is incorporated by reference herein in its entirety. The size and location of the kinematic pins are standardized so that the pods of various suppliers are compatible with each other. The industry standard for the location and dimensions of the kinematic coupling pins are set by Semiconductor Equipment and Materials International ("SEMI").

Occasionally, it is advantageous to purge a pod of contaminants and/or particulates by creating a current flow through a pod to carry away the contaminants and/or particulates. It may also be beneficial to fill a pod with a non-reactive gas for longer term storage and certain processes. Additionally, it may be advantageous on occasion to provide the pod with a pressure higher or lower than ambient. In order to accomplish such purging, it is known to provide one or more valves within a pod which allow fluid flow to and/or from the interior of the pod. Inlet valves to the pod may be connected to a pressurized gas source to fill the pod with a desired gas, and outlet valves may be connected to a vacuum source to remove gas from the pod. The inlet and outlet valves may be used to purge the pod, including filling the pod with a desired gas, and/or providing a pressure differential within the pod relative to ambient. Such a system is disclosed in U.S. Pat. No. 4,724,874, entitled "Sealable Transportable Container Having a Particle Filtering System", to Parikh et al., previously incorporated herein by reference. Relative to systems which require opening of the pod for purging, valve systems require less components and space, and in general operate more efficiently.

Regardless of the mechanisms by which purging occurs, it is desirable to supply the purging gas from the gas source only when a pod is seated on the support surface. One reason is that the gas injected into the pod, typically nitrogen, can be harmful to fab personnel if released into the fab environment in large quantities. Therefore, it is preferable to activate gas flow when a pod to be purged is located on the support surface, and to deactivate gas flow once the pod is removed.

It is known to provide electrically controlled actuators and/or controllers, such as for example a mass flow controller, for activating, deactivating and regulating the flow of gas to a pod. It is also known to provide sensors for indicating the presence or absence of a pod on the support surface. Each of these systems require control circuitry for transferring sensor and power signals between the control system and the gas flow system. This complicates the control system, and also increases the likelihood of a malfunction at one or more of the purging stations.

SUMMARY OF THE INVENTION

It is therefore an advantage of the present invention to provide a simple and reliable system for activating and deactivating gas flow to a pod.

It is a further advantage of the present invention to provide a system for activating and deactivating gas flow to a pod which does not utilize associated electrical connections, power supply, sensors or controllers.

It is another advantage of the present invention to completely seal off gas flow into the wafer fab environment when a pod is absent from the support platform.

It is a still further advantage of the present invention to provide a passive gas flow valve on the support platform, which gas flow valve has a low profile so as to allow implementation in a limited space.

It is another advantage of the present invention to provide a passive valve for controlling the flow of gas to a pod, which valve may be incorporated into one or more of the kinematic pins conventionally provided on the support platform.

These and other advantages are provided by the present invention which in preferred embodiments relates to a valve seated within a pod support platform for activating and deactivating the flow of gas to a pod on the platform. In preferred embodiments, the valve includes a central poppet capable of moving between a first, closed position where the poppet blocks the flow of gas through the valve, and a second, open position where the poppet allows gas flow through the valve. In the absence of a pod on the support platform, pressurized gas from the gas source downstream of the valve biases the poppet into the first position to thereby block gas flow. In this first position, a top portion of the poppet extends slightly above the upper surface of the pod support platform. When a pod is seated on the support platform, the weight of the pod moves the poppet from its first position to its second position where gas is allowed to flow through the valve and into the pod to allow purging of the pod.

BRIEF DESCRIPTION OF THE DRAWINGS

The present invention will now be described with reference to the drawings in which.

DETAILED DESCRIPTION

The invention will now be described with reference to FIGS. 1–8, which in general relate to various embodimnents of a passively activated gas flow valve for activating and deactivating the flow of gas to a SMIF pod. It is understood that the flow valve according to the present invention may be used with pods of various sizes including 200 mm and 300 mm pods, as well as carriers other than SMIF pods. Moreover, the gas flow valve according to the present invention complies with and allows compliance with all relevant SEMI standards.

Figure 1:
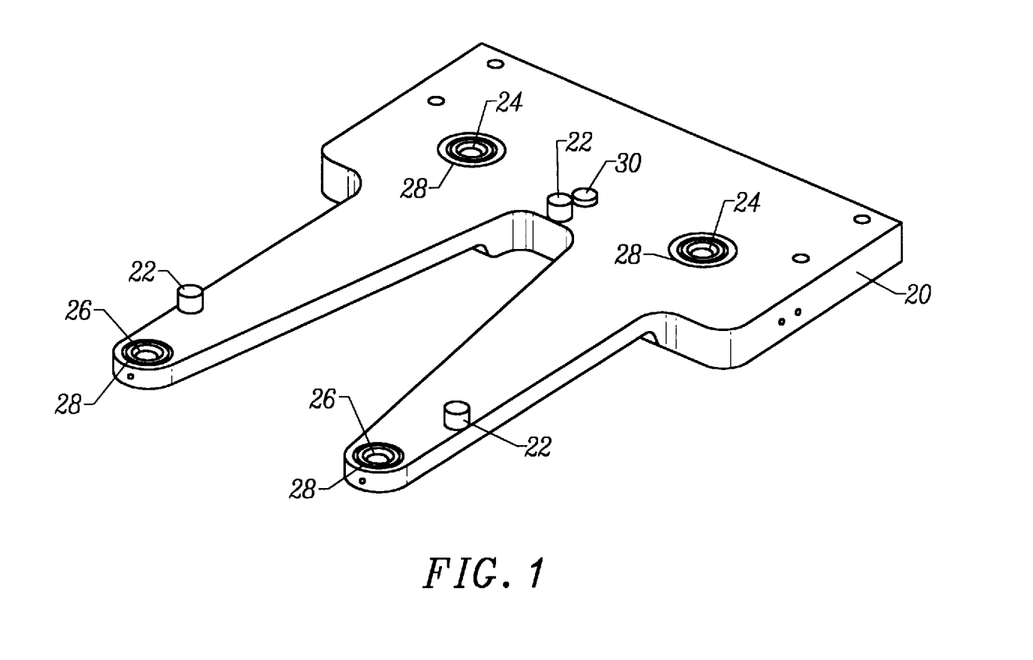
FIG. 1 is a perspective view of a pod support platform including a passive gas flow valve according to a preferred embodiment of the present invention.
Figure 2:
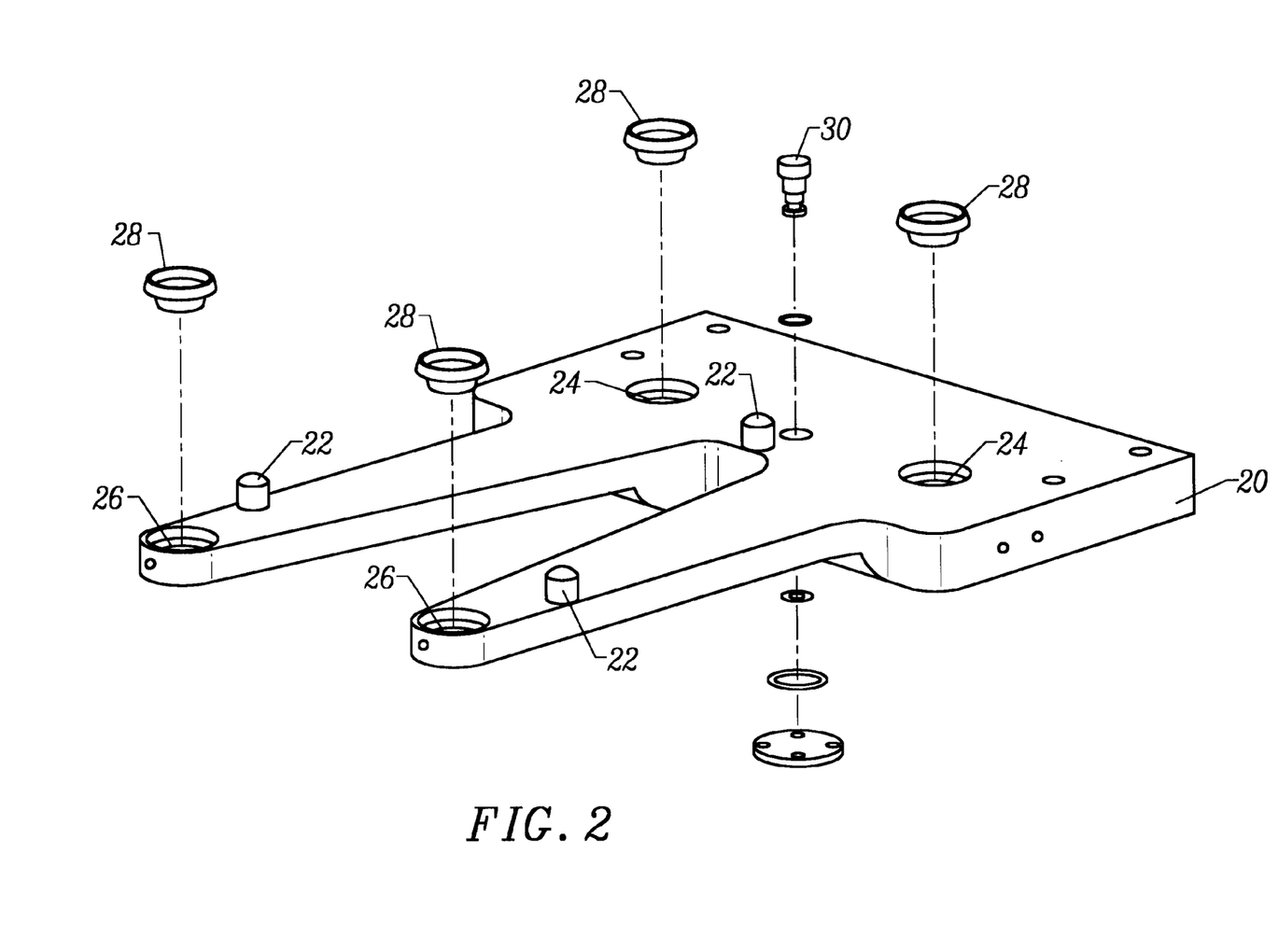
FIG. 2 is an exploded perspective view of the pod support platform shown in FIG. 1.

Referring now to FIGS. 1 and 2, there are shown perspective views of a support platform 20 for supporting a SMIF pod (not shown in FIGS. 1 or 2). The preferred embodiment of the support platform has a novel configuration to facilitate improved handoff of a pod between the support platform and an end effector. This aspect of the invention is described with respect to FIGS. 7 and 8 hereinafter. However, it is understood that the configuration of the support platform 20 is not critical to embodiments of the present invention directed solely to the passive gas flow valve. The support platform 20 may comprise any of various surfaces within a wafer fab provided for supporting a pod. Such surfaces include but are not limited to tool load ports, pod shelves within local tool buffers and stockers, and pod support platforms within standalone purge stations.

Support platform 20 includes a plurality of kinematic pins 22 for mounting within corresponding grooves on the bottom of a pod to establish a kinematic coupling between the pod and support platform. Pins 22 may alternatively comprise registration pins for receiving a 200 mm pod. The support platform 20 further includes a pair of inlet holes 24 provided down through the support platform and connecting to a respective pair of gas flow lines. The gas flow lines from the inlet holes are in turn connected to a pressurized gas source, so that gas may be injected into the pod through the inlet holes 24. Support platform 20 further includes a pair of outlet holes 26 provided down through the support platform and connecting to a pair of gas flow lines. The gas flow lines from the outlet holes are in turn connected to a vacuum source, so that gas may be drawn away from the pod through the outlet holes 26. It is understood that there may be one or greater than two inlet holes 24 in alternative embodiments, and it is understood that there may be zero, one or more than two outlet holes 26 in alternative embodiments.

In a preferred embodiment, inlet holes 24 are located at a rear of the support platform, and outlet holes 26 are located at a front of the platform. Thus, when a pod is located on the support platform, inlet holes 24 will be located under a rear of the pod, and outlet holes 26 will be located under a front of the pod. With such a configuration, a purging flow through the pod may occur from a rear of the pod forward. Each of the inlet and outlet holes preferably include an interface seal 28 as described for example in U.S. patent application Ser. No. 09/049,330, entitled "Kinematic Coupling Compatible, Passive Interface Seal", previously incorporated by reference.

Support platform 20 further includes a gas flow valve 30 for activating and deactivating gas flow to inlet holes 24. As shown in FIGS. 1 and 2, the valve 30 is separate from the kinematic pins 22. However, as explained hereinafter, the valve 30 may be incorporated into one or more of the kinematic pins 22 in alternative embodiments of the present invention. An upper surface of valve 30 preferably extends two to three millimeters above the upper surface of support platform 20. In embodiments of the present invention where the gas flow valve is integrated into one or more of the kinematic pins, the height of the one or more kinematic pins is increased by two to three millimeters. It is understood that these dimensions are by way of example and may vary in alternative embodiments. As shown in FIGS. 1 and 2, only one gas flow valve 30 is provided, which gas flow valve activates and deactivates gas flow through inlet holes 24. However, as explained hereinafter, a second gas flow valve 30 may be added to activate and deactivate gas flow through outlet holes 26.

Referring now to FIGS. 1 through 4, in a preferred embodiment of the present invention, gas from a pressurized gas source (not shown) is provided to the gas flow valve 30 via a gas line 32. When the valve is in an open position as explained hereinafter, gas flows through the valve and exits the valve through a gas line 34 which is in turn connected to both inlet holes 24. In embodiments having less than or greater than two inlet holes 24, the gas line 34 would be connected to each such inlet hole.

Figure 3:
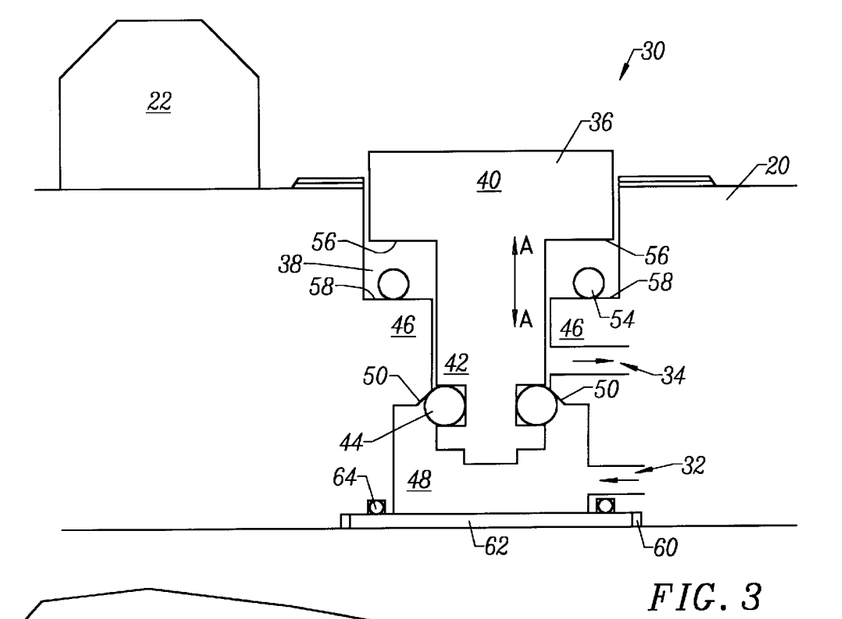
FIG. 3 is a cross-sectional side view of the valve according to the present invention in its closed position blocking gas flow through the valve.
Figure 4:
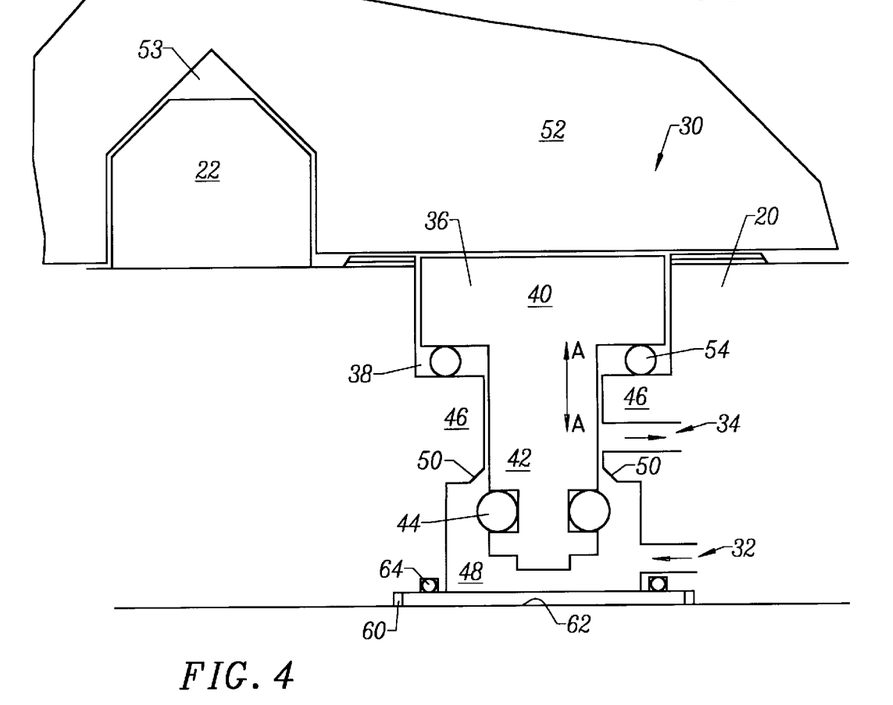
FIG. 4 is a cross-sectional side view of the valve according to the present invention in its open position allowing gas flow through the valve.

Referring specifically now to FIGS. 3 and 4, valve 30 includes a poppet 36 mounted for vertical translation within a cavity 38 formed within the support platform 20. Poppet 36 and cavity 38 are preferably annular, but could be other cross-sectional shapes in alternative embodiments of the present invention. The poppet includes a head portion 40 and a stem portion 42 extending down from the head portion. An O-ring 44 is provided around the stem portion toward a bottom of the stem portion. The O-ring preferably has a wider exterior diameter than the adjacent sections of the stem portion for reasons that will be explained hereinafter. Poppet 36 is preferably formed of a low wear, low out gassing material such as for example polycarbonate, stainless steel, or aluminum. The O-ring 44 is preferably formed of a durable elastic material such as various elastomers.

The support platform wall defining cavity 38 preferably include a collar 46 for supporting the stem portion 42 of poppet 36 to substantially prevent movement of the poppet in a plane parallel to the upper surface of support platform 20 while allowing movement of poppet 36 in a direction along arrow A—A substantially perpendicular to the upper surface of support platform 20. Cavity 38 includes a lower chamber 48 which is open to both gas flow lines 32 and 34.

In the absence of any external biasing forces, the force of gravity will bias the poppet into the position shown in FIG. 4. However, once gas from the pressurized gas source is received through gas line 32, the gas within lower chamber 48 will force the poppet upward to the position shown in FIG. 3 thereby closing the valve 30 and preventing gas flow through the valve. In particular, when poppet 36 moves upward, O-ring 44 engages surfaces 50 of the support platform 20 to thereby form a seal which prevents gas within lower chamber 48 from flowing through the valve to gas flow line 34. In the absence of other external forces on poppet 36, the valve 30 will remain in the closed position shown in FIG. 3 to prevent gas from escaping into the environment of the wafer fab.

In the closed position of FIG. 3, head portion 40 of the poppet 36 extends above the surface of the support platform as described above. As shown in FIG. 4, upon location of a pod 52 on a support platform 20 (shown with a groove 53 of the pod seated on the kinematic pin 22), the pod will engage head portion 40 and the weight of the pod will move the poppet from the closed position shown in FIG. 3 to the open position shown in FIG. 4. In particular, in the open position shown in FIG. 4, the O-ring 44 is now spaced away from surfaces 50 so that gas from the gas source may flow in through line 32, up through the chamber 48 and out gas line 34. Thereafter, gas from line 34 passes into the pod 52 via inlet holes 24 and interface seals 28.

When the valve is in the open position shown in FIG. 4, in order to prevent gas from leaking around the head portion 40 and out into the environment of the wafer fab, a second O-ring 54 is mounted within cavity 38. When poppet 36 is moved downward by the weight of the pod to open the valve 30, O-ring 54 gets sandwiched between a surface 56 of the poppet and a surface 58 of the support platform 20 to form a seal which prevents gas flow past the stem portion 42 of the poppet 36. O-ring 54 may alternatively be affixed to the poppet 36. Although a particular configuration of valve 30 is shown above, it is understood that the size and configuration of poppet 36 and cavity 38 may vary in alternative embodiments while still accomplishing the function of valve 30.

In order to mount the poppet 36 within cavity 38, an opening 60 may be provided on the lower surface of support platform 20. Once the poppet is mounted through opening 60 and into cavity 38, a plate 62 may seal the opening 60. Optionally, a third O-ring 64 may be provided between the lower surface of the support platform 20 and the plate 62 to prevent gas from escaping around plate 62 into the environment of the wafer fab. In an alternative embodiment, as opposed to inserting a poppet 36 alone up through opening 60, a preassembled valve 30 including poppet 36 and surrounding walls that form cavity 38 may comprise a cartridge which may be inserted through opening 60 and mounted to support platform 20. Details of other such cartridges are disclosed in U.S. patent application Ser. No. 09/049,354, entitled "Modular SMIF Pod Breather, Adsorbent, and Purge Cartridges", previously incorporated by reference.

As indicated above, poppet 36 is biased upward as a result of gas entering the lower chamber 48 through line 32 to close the valve 30 in the absence of a pod on support platform 20. However, in an alternative embodiment of the present invention shown in FIG. 5, a spring 66 may be provided under compression between plate 62 and a portion of poppet 36. Spring 66 will bias poppet 36 upward to close the valve in the absence of a pod on support platform 20. However, upon placement of a pod onto support platform 20, the weight of the pod downward on poppet 36 will exceed the force of spring 66 upward, so that the poppet 36 will move downward and into an open position allowing gas flow through the valve.

Figure 6:
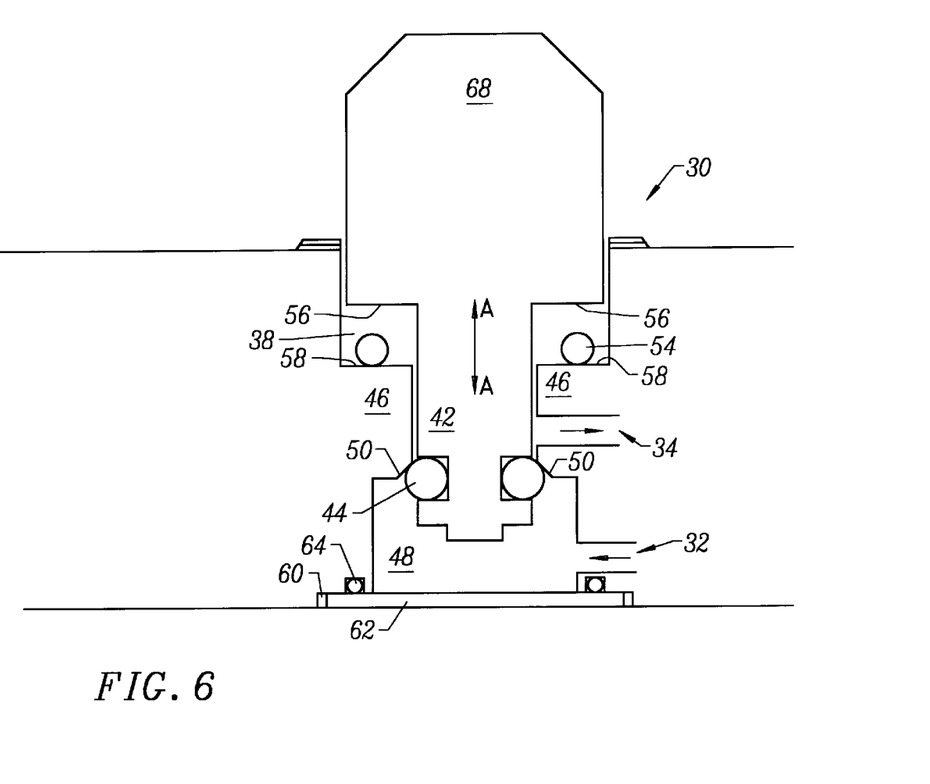
FIG. 6 is a cross-sectional side view of a valve according to a further alternative embodiment of the present invention shown in its closed position blocking gas flow through the valve.

In the embodiment shown in FIGS. 3 and 4, poppet 36 is separate from kinematic pins 22. However, an alternative embodiment of the present invention shown in FIG. 6 shows a pin 68 functioning as both a kinematic pin and the poppet of valve 30. Components which are common to the embodiments of the invention shown in FIGS. 4 and 6 are denoted with like reference numerals. In this embodiment, the kinematic pin 68 is biased upward by the gas within lower chamber 48 and/or by a spring 66 as described above so that a top of the kinematic pin is approximately two to three millimeters above the top of the other, conventional kinematic pins. This height may vary in alternative embodiments. In this position, shown in FIG. 6, gas flow through valve 30 is prevented. However, upon location of a pod on support platform 20, the kinematic pin 68 will move downward to thereby open valve 30 to allow gas flow therethrough. Kinematic pin 68 additionally meets all the specifications set forth in SEMI Standard SEMI E57.1 for kinematic pins.

Figure 5:
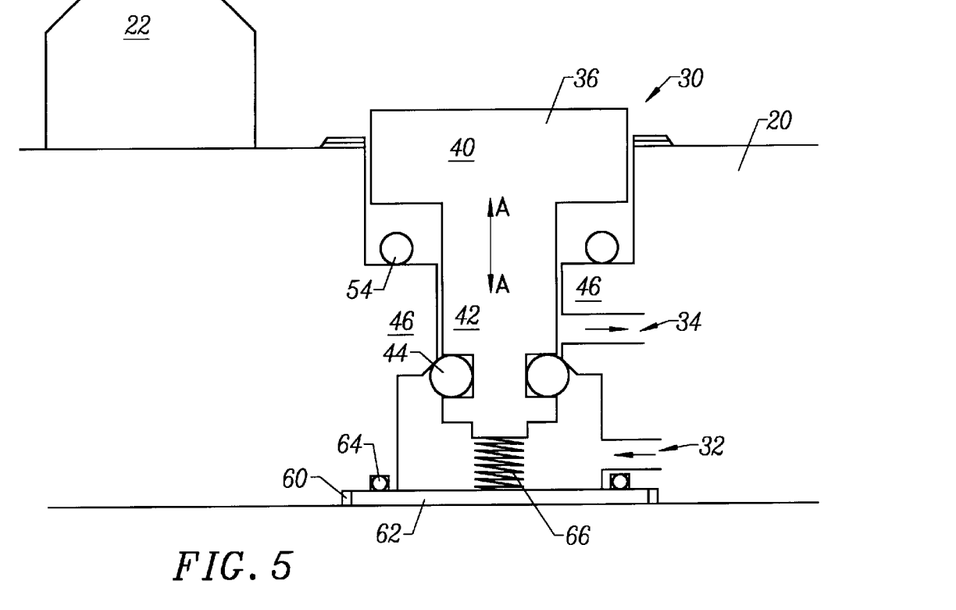
FIG. 5 is a cross-sectional side view of a valve according to an alternative embodiment of the present invention shown in its closed position blocking gas flow through the valve.

In a preferred embodiment, gas flow valve 30 is provided in communication with inlet holes 24 only. However, in an alternative embodiment of the present invention, a gas flow valve may be additionally be provided in communication with outlet holes 26 to prevent the flow of gas through the outlet holes in the absence of a pod on the support platform. Such a valve would be identical to a valve 30 connected to the inlet holes 24, with the addition that a spring 66 as shown in FIG. 5 is necessary to maintain the valve in a closed position in the absence of a pod on support platform 20. Where there are two valves, one for the inlet gas flow and one for the outlet gas flow, there may be two separate protrusions (i.e., the head portion of each valve) above the surface of the support platform. Alternatively, there may be a single protrusion above the surface of the sport platform which is connected to the two valves. In such an embodiment, when the protrusion is forced downward by the weight of the pod, the protrusion in turn forces the poppets of the two separate valves downward to open each of the valves. It is further conceivable that a single valve could have two separate compartments, with one compartment activating and deactivating flow to the inlet holes and the other compartment activating and deactivating flow to the outlet holes. This valve would have a single stem portion extending through both compartments, such that actuation of the single poppet downward by the weight of the pod would initiate gas flow to both the inlet and outlet holes (while keeping the inlet and outlet flows separate).

According to the present invention, the valve 30 may simply and reliably allow gas flow to a pod when a pod is present on the support platform, and block gas flow in the absence of a pod, all without the need of electronic sensors and/or complicated controllers. Additionally, as the valve is activated by the weight of the pod itself, the valve is much less likely to malfunction or indicate a false presence of the pod as compared to conventional electronic sensors and flow controllers.

However, it is understood that in alternative embodiments of the present invention, instead of functioning as a gas flow valve, the member 30 may simply act as a mechanical sensor to indicate the presence or absence of a pod on a support platform 20. In such an embodiment, once the mechanical sensor is biased downward as a result of the weight of a pod, the mechanical sensor may generate a pneumatic signal which is sent to the control system to initiate the flow of gas to the pod. For example, in one such alternative embodiment, the valve 30 may be connected to a pressurized gas source, which is a separate and independent gas source than that used as the purging gas. Once the valve 30 was actuated by the weight of the pod, gas from the second gas source would flow through the valve 30 to a second valve, which is pneumatically actuated by the gas flow from the second independent gas source. The second valve may be for example a high purity diaphragm valve. This high purity valve is connected to the purging gas source. Thus, upon actuation of the high purity valve, the purging gas would flow through the high purity valve to the inlet holes 24.

Although the invention has been described thus far as a valve which is mounted in a horizontal support platform, with a portion of the valve extending up through a top surface of the platform, it is understood that the valve 30 may be mounted in a non-horizontal surface in alternative embodiments. For example, when using front opening pods, it is known to support the pods on a horizontal platform, while a door of the pod lies against a vertical surface. It is contemplated that the valve 30 could be mounted horizontally in the vertical surface with a portion of the valve 30 protruding out past the front of the vertical surface. In this case, the valve 30 would be actuated when the pod was loaded onto the horizontal support platform and the vertical pod door came into contact with, and exerted a force on, the portion of the valve protruding past the vertical surface.

Figure 7:
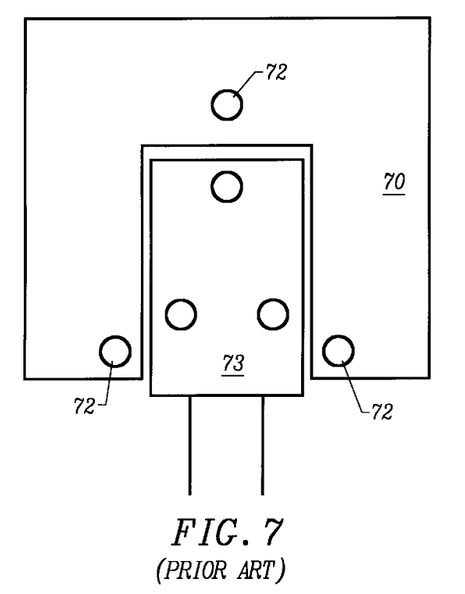
FIG. 7 is a top view of a conventional end effector and pod support platform arrangement for allowing hand off of the pod between the end effector and the support platform.

It is understood that, as a pod is being transported to the support platform 20, the pod may be supported from its sides or top. In such embodiments, the shape of the support platform 20 may be square or rectangle. However, it is also known to transport a pod to support platform 20 on an end effector while it is supported at its bottom surface. One such conventional system is shown in FIG. 7. As shown therein, support platform 70 has a horseshoe configuration including three primary kinematic pins 72. The primary kinematic pins are positioned to seat within an outer portion of the grooves provided on the underside of the pod (i.e., a portion of the grooves farthest from the radial center of the pod). An end effector 73 in turn includes three secondary pins for supporting the pod during transport, which secondary pins seat within an inner portion of the grooves on the underside of the pod (i.e., a portion of the grooves nearest to the radial center of the pod). In order to transfer a pod from the end effector to the support platform, the end effector moves in and, once properly positioned, lowers so that the pod is handed off from the secondary pins on the end effector to the primary pins on the support platform.

Figure 8:
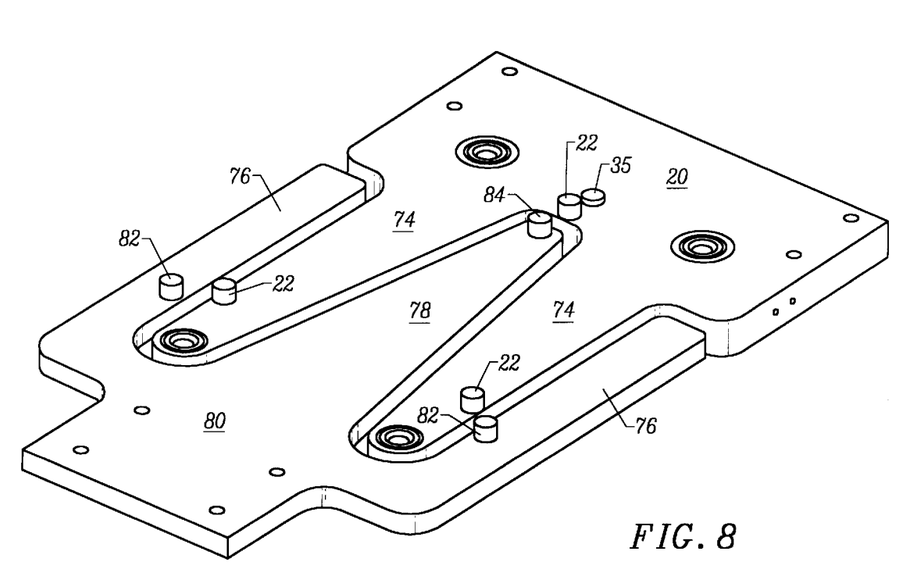
FIG. 8 shows an end effector and pod support platform according to the present invention for allowing hand off of the pod between the end effector and the pod support platform.

According to a preferred embodiment of the present invention shown in FIG. 8, the support platform may include a pair of fingers 74 which are configured to intermesh with two outer fingers 76 and one inner finger 78 on an end effector 80. In comparison to prior art end effectors which included kinematic pins each located in the secondary position, end effector 80 includes two kinematic pins 82 located at the base of fingers 76 in the primary position and one kinematic pin 84 located at the end of finger 78 in the secondary position. Correspondingly, support platform 20 includes two kinematic pins 22 at the ends of fingers 74 in the secondary position, and one kinematic pin 22 at the base of and in between fingers 74 in the primary position.

According to this embodiment, the kinematic pins on end effector 80 are spaced apart a greater distance from each other in comparison to the kinematic pins on a conventional end effector, thus providing a larger support base on which to support the pod. This lessens the likelihood that the pod will fall off the end effector during transport. Additionally, it has been found that there is a tendency for a pod to tip about an axis between the kinematic pin 84 at the front end of the end effector and either of the kinematic pins 82 toward the rear of the end effector. Thus, according to the present invention, outer fingers 76 are provided which lend additional support to the pod during transport and prevent tipping of the pod about an axis between kinematic pin 84 and either of kinematic pins 82.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A system for purging a carrier with a gas from a gas source as the carrier is in contact with a support surface, comprising:

a valve capable of being mounted within the support platform so that a portion of said valve protrudes past the support surface in the absence of a force biasing said portion into said surface, the valve is capable of occupying a first state where the gas is prevented from passing through the valve and a second state where the gas passes through the valve to purge the carrier;

wherein a force exerted by the carrier on said portion of said valve protruding past said support surface is capable of actuating said valve from said first state to said second state.

2. A system for purging a carrier with a gas from a gas source as recited in claim 1, wherein the gas from the gas source biases said valve into said first position.

3. A system for purging a carrier with a gas from a gas source as recited in claim 1, wherein the a spring biases said valve into said first position.

4. A system for purging a carrier with a gas from a gas source as recited in claim 1, wherein the support platform is part of a load port.

5. A system for purging a carrier with a gas from a gas source as recited in claim 1, wherein the support platform is part of a stocker.

6. A system for purging a carrier with a gas from a gas source as recited in claim 1, wherein the support platform is part of a station dedicated to purging carriers.

7. A system for purging a carrier with a gas from a gas source, comprising:

a support platform for supporting the carrier during purging;

a valve mounted within said support platform, said valve including a portion at least partially protruding above an upper surface of said support platform in the absence of a force biasing said portion downward, the valve is capable of occupying a first state where the gas is prevented from passing through the valve and a second state where the gas passes through the valve to purge the carrier;

wherein a weight of the carrier down on said portion of said valve protruding above said upper surface of the support platform is capable of actuating said valve from said first state to said second state.

8. A system for purging a carrier, said system including a purging gas from a first gas source, a working fluid from a second fluid source and a first valve, the first valve allows the purging gas to pass through the first valve to purge the carrier when the first valve is in a first state and the first valve preventing the purging gas from passing through the first valve when the first valve is in a second state, said working fluid capable of switching the first valve between the first and second states, the system comprising:

a support platform for supporting the carrier during purging;

a second valve capable of being mounted within the support platform so that a portion of said second valve protrudes past the support surface in the absence of a force biasing said portion into said surface, the second valve is capable of occupying a first state where the working fluid is prevented from passing through the second valve and a second state where the working fluid passes through the second valve to actuate the first valve;

wherein a force exerted by the carrier on said portion of said second valve protruding past said support surface is capable of actuating said second valve from said first state to said second state.

9. A system for transferring and supporting a carrier, comprising:

a support platform for supporting the carrier, said support platform including first and second fingers, and including a first kinematic pin near an end of said first finger, a second kinematic pin near an end of said second finger, and a third kinematic pin at a base of, and in between, said first and second fingers, said first and second pins occupying secondary positions and said third kinematic pin occupying a primary position; and an end effector for transferring the carrier, said end effector including first and second outer fingers and a central finger, and including a fourth kinematic pin along a length of said first outer finger, a fifth kinematic pin along a length of said second outer finger, and a sixth kinematic pin near an end of said central finger, said fourth and fifth kinematic pins occupying primary positions and said sixth kinematic pin occupying a secondary position;

wherein said end effector may transfer the carrier to and from the support platform.

* * * * *